United States Patent
Kwon et al.

(10) Patent No.: US 10,347,699 B2
(45) Date of Patent: Jul. 9, 2019

(54) ORGANIC LIGHT EMITTING DIODE DISPLAY AND METHOD OF MANUFACTURING THE SAME

(71) Applicant: Samsung Display Co., Ltd., Yongin-si, Gyeonggi-do (KR)

(72) Inventors: Oh June Kwon, Hwaseong-si (KR); Seung Yong Song, Suwon-si (KR); Hyeon Sik Kim, Yongin-si (KR)

(73) Assignee: Smsung Display Co., Ltd. (KR)

( * ) Notice: Subject to any disclaimer, the term of this patent is extended or adjusted under 35 U.S.C. 154(b) by 265 days.

(21) Appl. No.: 14/879,753

(22) Filed: Oct. 9, 2015

(65) Prior Publication Data
US 2016/0218151 A1 Jul. 28, 2016

(30) Foreign Application Priority Data
Jan. 28, 2015 (KR) .......................... 10-2015-0013773

(51) Int. Cl.
*G06F 1/16* (2006.01)
*G06F 3/041* (2006.01)
(Continued)

(52) U.S. Cl.
CPC .............. *H01L 27/323* (2013.01); *G06F 1/16* (2013.01); *G06F 3/0412* (2013.01);
(Continued)

(58) Field of Classification Search
CPC ..... H01L 27/323; H01L 27/3276; G06F 1/16; G06F 3/0412; G06F 3/047;
(Continued)

(56) References Cited

U.S. PATENT DOCUMENTS 8,354,306 B2  1/2013 Kim et al.
8,368,656 B2  2/2013 Wang et al.
(Continued)

FOREIGN PATENT DOCUMENTS

CN  103943061 A  7/2014
CN  104252276 A  12/2014
(Continued)

OTHER PUBLICATIONS

European Patent Application No. 16150862.7, EP Search Report, dated Jun. 29, 2016, pp. 1-8.

*Primary Examiner* — Julie Anne Watko
(74) *Attorney, Agent, or Firm* — Innovation Counsel LLP

(57) ABSTRACT

Disclosed herein is an organic light emitting diode display, including: an insulating substrate including a display area in which a plurality of pixels are formed and a peripheral area positioned around the display area; a touch signal transfer wiring positioned in the peripheral area on the insulating substrate; an insulating layer formed on the insulating substrate, the insulating layer covering the touch signal transfer wiring and including a protrusion and an opening through which the touch signal transfer wiring is partially exposed; a connection conductor connected to the touch signal transfer wiring through the opening; an encapsulation substrate including a touch area corresponding to the display area and a peripheral area positioned around the touch area; a touch electrode layer positioned under the touch area of the encapsulation substrate; and a touch wiring connected to the touch electrode layer and positioned under the peripheral area of the encapsulation substrate.

15 Claims, 21 Drawing Sheets

(51) Int. Cl.
*H01L 27/32* (2006.01)
*G06F 3/047* (2006.01)
*G06F 3/042* (2006.01)
*G06F 3/045* (2006.01)
*G06F 3/044* (2006.01)
*G06F 3/046* (2006.01)

(52) U.S. Cl.
CPC .......... *H01L 27/3276* (2013.01); *G06F 3/042* (2013.01); *G06F 3/044* (2013.01); *G06F 3/045* (2013.01); *G06F 3/046* (2013.01); *G06F 3/047* (2013.01); *G06F 2203/04103* (2013.01)

(58) Field of Classification Search
CPC ........... G06F 2203/04103; G06F 3/042; G06F 3/044; G06F 3/045; G06F 3/046
See application file for complete search history.

(56) References Cited

U.S. PATENT DOCUMENTS

| | | |
|---|---|---|
| 8,530,766 B2 | 9/2013 | Choi |
| 2014/0014960 A1 | 1/2014 | Yamazaki et al. |
| 2015/0162387 A1 | 6/2015 | Gu et al. |
| 2015/0380467 A1 | 12/2015 | Su |

FOREIGN PATENT DOCUMENTS

| | | |
|---|---|---|
| KR | 10-2013-0046263 | 5/2013 |
| KR | 10-2013-0057700 | 6/2013 |
| KR | 10-2013-0063971 | 6/2013 |
| KR | 10-2014-0013515 | 2/2014 |

ORGANIC LIGHT EMITTING DIODE DISPLAY AND METHOD OF MANUFACTURING THE SAME

CROSS-REFERENCE TO RELATED APPLICATION

This application claims priority to and the benefit of Korean Patent Application No. 10-2015-0013773 filed in the Korean Intellectual Property Office on Jan. 28, 2015, the entire contents of which are incorporated herein by reference.

BACKGROUND (a) Field of the Disclosure

The present disclosure relates to an organic light emitting diode display including a touch sensor and a method of manufacturing the same.

(b) Description of the Related Art

Recently, the importance of flat panel displays having excellent characteristics such as thinness, weight reduction, and low power consumption has increased. Among the flat panel displays, liquid crystal displays and organic light emitting diode displays, which include a thin film transistor, have been widely commercialized as display devices, such as a television, a laptop, a tablet computer, and a desk top computer, due to their excellent resolution, color display, image quality, and the like. In particular, organic light emitting diode displays have a fast response speed, low power consumption, and a wide viewing angle due to its self-emissive technology and therefore have drawn much attention as the next generation of flat panel displays.

Furthermore, since organic light emitting diode displays are manufactured by a simple manufacturing process, the production cost of organic light emitting diode displays may be less than that of existing liquid crystal displays.

An organic light emitting diode display may include a touch sensing function for receiving user interactions, in addition to an image displaying function. The touch sensing function may sense a change in pressure applied to a screen of the display, a change in charge, a change in light, and the like, when a user approaches or contacts his/her finger, a touch pen, or the like, to the screen (e.g., to write characters or draw pictures) so as to determine whether and where objects approach or contact the screen, and the like. The organic light emitting diode display may include a touch panel to receive an image signal and display an image based on the contact information.

Examples of the touch panel type may include an add-on type in which the touch panel is attached to an outer surface of the organic light emitting diode display, an on-cell type in which the touch panel is deposited on the organic light emitting diode display, and an in-cell type in which the touch panel is formed inside the organic light emitting diode display, and the like.

The add-on type touch panel is formed in an external form, and therefore may be overly thick and provide reduced visibility. The on-cell type touch panel may have defects, such as foreign particles and scratches, due to exposure of its touch electrodes that are formed on the organic light emitting diode display. Therefore, the in-cell type touch panel has become popular recently.

However, the in-cell type touch panel additionally requires a separate insertion to conduct between touch signal transfer wirings, which transfer signals to the touch electrode and are positioned on a touch electrode, and an insulating substrate positioned under an encapsulation substrate.

The above information disclosed in this Background section is only for enhancement of understanding of the background of the disclosure and therefore may contain information that does not form the prior art that is already known in this country to a person of ordinary skill in the art.

SUMMARY

The present disclosure provides an organic light emitting diode display having advantages of conducting a touch signal transfer wiring formed on an insulating substrate with a touch wiring connected to a touch electrode layer positioned under an encapsulation substrate, without a separate additional process.

An exemplary embodiment of the present disclosure provides an organic light emitting diode display, including: an insulating substrate including a display area in which a plurality of pixels are formed and a peripheral area positioned around the display area; a touch signal transfer wiring positioned in the peripheral area on the insulating substrate; an insulating layer formed on the insulating substrate, the insulating layer covering at least a portion of the touch signal transfer wiring and including a protrusion formed to protrude upward and an opening through which the touch signal transfer wiring is partially exposed; a connection conductor connected to the touch signal transfer wiring through the opening and formed on the insulating layer; an encapsulation formed facing the insulating substrate and substrate including a touch area corresponding to the display area and a peripheral area positioned around the touch area; a touch electrode layer positioned under the touch area of the encapsulation substrate; and a touch wiring connected to the touch electrode layer and positioned under the peripheral area of the encapsulation substrate.

The connection conductor may conduct the touch signal transfer wiring with the touch wiring.

The connection conductor may be disposed in the peripheral area of the insulating substrate.

The organic light emitting diode display may further include: a sealing member positioned at an outer region of the peripheral area of the insulating substrate, wherein the connection conductor is positioned inside the sealing member.

The protrusion may completely enclose a circumference of the opening.

The organic light emitting diode display may further include: a sub-connection conductor formed between the insulating layer and the connection conductor.

The sub-connection conductor may include Au or Ag.

The protrusion may be positioned at one side of the circumference of the opening.

The insulating layer may include a plurality of openings and the protrusion may enclose the plurality of openings.

The insulating layer and the connection conductor may be disposed in the display area.

The organic light emitting diode display may further include: a pixel electrode, an organic emission layer, a common electrode, and a pixel defined layer partitioning the organic emission layer that are positioned in the display area.

The protrusion may be made of the same material as the pixel defined layer.

The connection conductor may be made of the same material as the common electrode.

Another exemplary embodiment of the present disclosure provides a method of manufacturing an organic light emitting diode display, including: providing an insulating substrate including a display area in which a plurality of pixels are formed and a peripheral area positioned around the display area; forming a touch signal transfer wiring in the peripheral area on the insulating substrate; forming an insulating layer on the insulating substrate, the insulating layer covering the touch signal transfer wiring on the insulating substrate and including a protrusion formed to protrude upward and an opening through which the touch signal transfer wiring is partially exposed; forming a connection conductor connected to the touch signal transfer wiring through the opening on the insulating layer; providing an encapsulation substrate including a touch area corresponding to the display area and a peripheral area positioned around the touch area and facing the insulating substrate; forming a touch electrode layer under the touch area of the encapsulation substrate; forming a touch wiring under the peripheral area of the encapsulation substrate, the touch wiring connected to the touch electrode layer; and adhering the touch signal transfer wiring and the touch wiring to each other through the connection conductor by pressing the touch signal transfer wiring and the touch wiring toward each other.

The connection conductor may conduct the touch signal transfer wiring with the touch wiring.

The connection conductor may be disposed in the peripheral area of the insulating substrate.

The method may further include positioning a sealing member at an outer region of the peripheral area, wherein the connection conductor is positioned inside the sealing member.

The method may further include: forming a pixel electrode, an organic emission layer, a common electrode, and a pixel defined layer partitioning the organic emission layer in the display area.

The protrusion may be made of the same material as the pixel defined layer.

The connection conductor may be made of the same material as the common electrode.

In addition to the above-mentioned advantages of the present system and method, other features and advantages of the present system and method are described below or would be appreciated by those of ordinary skill in the art from the present disclosure.

According to an exemplary embodiment of the present disclosure, the following effects may be obtained.

According to an exemplary embodiment of the present disclosure, the organic light emitting diode display includes the protrusion and the connection conductor to conduct the touch signal transfer wiring positioned on the insulating substrate with the touch wiring positioned under the encapsulation substrate. The protrusion is made of the same material as the pixel defined layer that partitions the emission layer. The connection conductor is made of the same material as the common electrode to conduct the touch signal transfer wiring with the touch wiring so that an additional process of forming the separate insertion may be omitted.

In the organic light emitting diode display according to an exemplary embodiment of the present disclosure, the protrusion and the connection conductor are formed inside the sealing member so that the insulating substrate adheres to the encapsulation substrate to prevent internal penetration of out gassing that occurs at the time of forming the sealing member, thereby improving the lifespan of the organic light emitting diode display.

Further, other features and advantages may be understood based on the exemplary embodiments of the present disclosure.

DETAILED DESCRIPTION OF THE EMBODIMENTS

Figure 1:
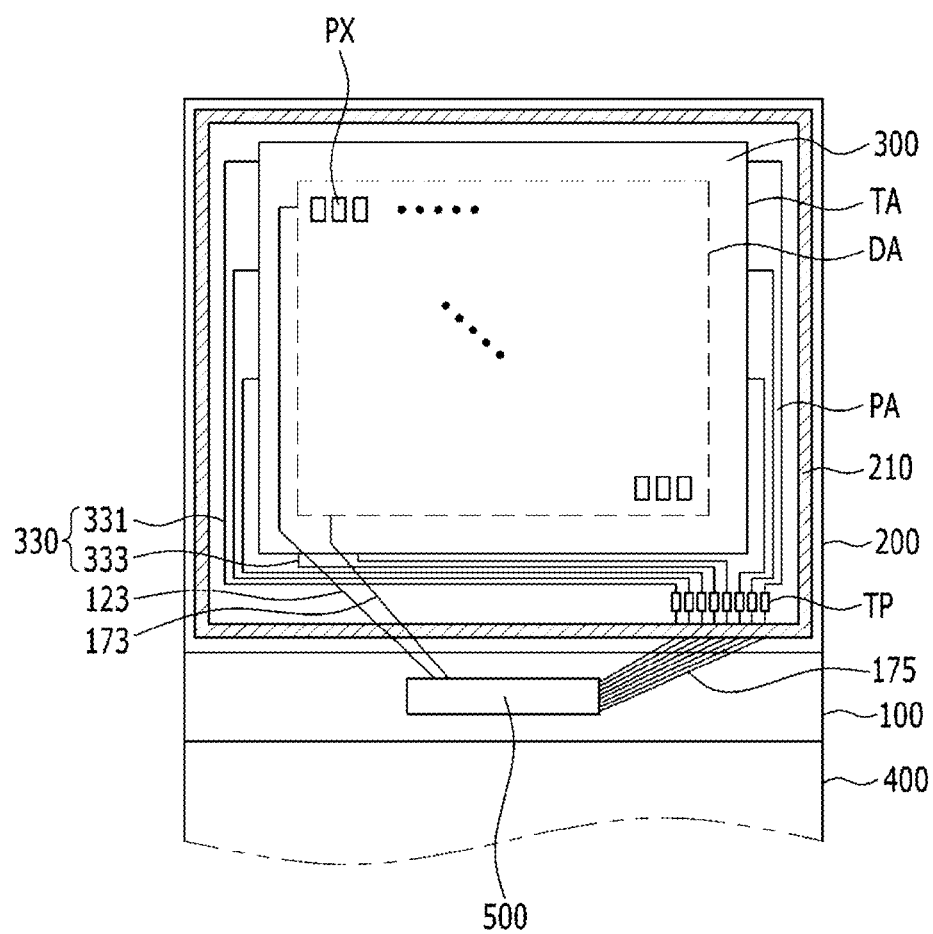
FIG. 1 is a plan view of a display device according to an exemplary embodiment of the present disclosure.

Hereinafter, exemplary embodiments of the present disclosure are described in detail with reference to the accompanying drawings. However, the present disclosure is not limited to the exemplary embodiments set forth herein and encompasses modifications and different forms. On the contrary, exemplary embodiments introduced herein are provided to help those of ordinary skill in the art understand the present disclosure.

In the drawings, the thickness of layers, films, panels, regions, etc., are exaggerated for clarity. Further, it will be understood that when a layer is referred to as being "on" another layer or substrate, it may be directly on the other layer or substrate, or intervening them may also be present. Like reference numerals designate like elements throughout the specification.

Hereinafter, exemplary embodiments of the present disclosure are described in detail with reference to the accompanying drawings.

FIG. 1 is a plan view of a display device according to an exemplary embodiment of the present disclosure. Referring to FIG. 1, the display device includes an insulating substrate 100, an encapsulation substrate 200 facing the insulating substrate 100, and a flexible printed circuit board (PCB) 400 formed at an edge of the insulating substrate 100 and attached to the insulating substrate 100.

The insulating substrate 100 includes a display area DA in which a plurality of pixels PXs are formed, and a peripheral area PA positioned around the display area DA.

The plurality of pixels PXs disposed in the display area DA of the insulating substrate 100 are each connected to a plurality of signal lines 123 and 173.

The peripheral area PA of the insulating substrate 100 is provided with a touch pad part TP, a touch signal transfer wiring 175 connected to the touch pad part TP and a driving driver 500 that is connected to the touch signal transfer wiring 175 and the plurality of signal lines 123 and 173.

The insulating substrate 100 is formed to have a region on one side in which the region does not overlap with the encapsulation substrate 200, and the driving driver 500 is disposed in that region on the insulating substrate 100.

The driving driver 500 may transfer a signal for driving the plurality of pixels PXs positioned in the display area DA and a touch electrode layer 300 positioned in the touch area TA.

Although not illustrated, the driving driver 500 is bonded to the flexible printed circuit board (PCB) 400 and may be controlled by a controller (not illustrated) that is included in the flexible printed circuit board (PCB) 400.

The encapsulation substrate 200 includes a touch area TA corresponding to and overlapping the display area DA of the insulating substrate 100 and a peripheral area PA corresponding to the peripheral area PA of the insulating substrate 100 and positioned around the touch area TA. In the drawing, the peripheral area PA of the insulating substrate 100 and the peripheral area PA of the encapsulation substrate 200 are shown by the same reference numeral, but the peripheral area PA of the insulating substrate 100 and the peripheral area PA of the encapsulation substrate 200 may be changed depending on the touch area TA. That is, the touch area TA may overlap the entire display area DA and may also include a portion of the peripheral area PA. Further, the touch area TA may only overlap with the display area DA.

The touch electrode layer 300 may be disposed in the touch area TA under the encapsulation substrate 200 to sense a touch.

The touch electrode layer 300 may include a plurality of touch electrodes. The touch electrode layer 300 is connected to the touch pad part TP, which is disposed in the peripheral area PA, through the touch wiring 330.

The outer region of the peripheral area PA of the encapsulation substrate 200 may be provided with a sealing member 210.

The sealing member 210 is formed between the insulating substrate 100 and the encapsulation substrate 200 at the outer region of the peripheral area PA to bond the insulating substrate 100 to the encapsulation substrate 200. A laser is irradiated to the sealing member 210 at the outer region of the peripheral area PA to harden the sealing member 210, and thus the insulating substrate 100 is bonded to the encapsulation substrate 200.

Hereinafter, the touch pad part TP according to an exemplary embodiment of the present disclosure is described in detail with reference to FIGS. 1 to 3.

Figure 2:
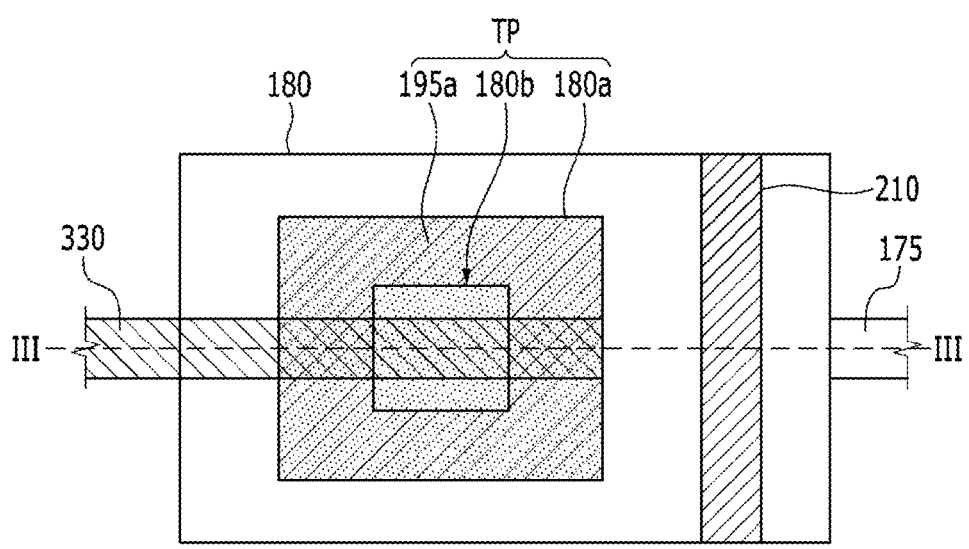
FIG. 2 is a plan view of a touch pad part according to an exemplary embodiment of the present disclosure.

FIG. 2 is a plan view of a touch pad part according to an exemplary embodiment of the present disclosure. FIG. 3 is a cross-sectional view of the touch pad part taken along the line III-III of FIG. 2 according to an exemplary embodiment of the present disclosure.

Figure 3:
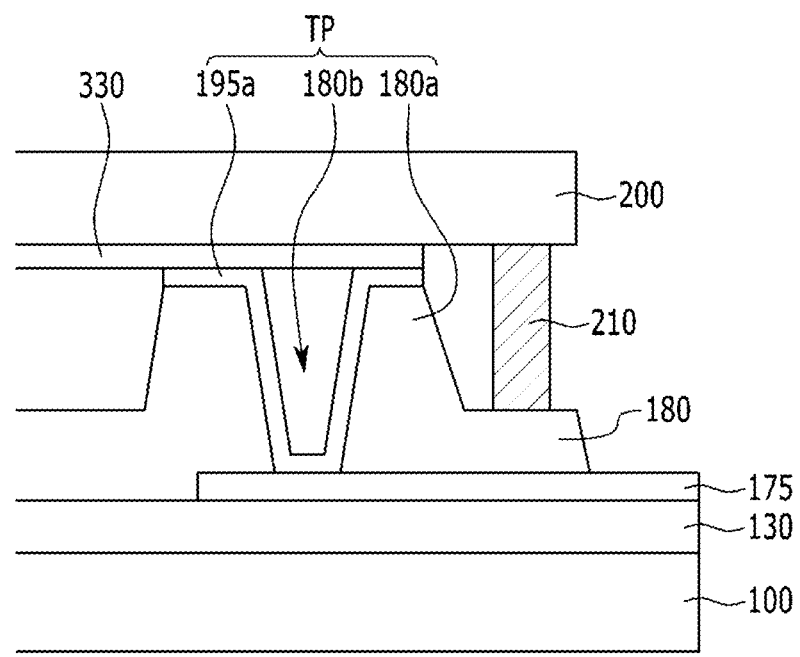
FIG. 3 is a cross-sectional view of the touch pad part according to an exemplary embodiment of the present disclosure.

Referring to FIGS. 1 to 3, the touch pad part TP according to an exemplary embodiment of the present disclosure may be positioned inside the sealing member 210 disposed at an edge of the peripheral area PA of the insulating substrate 100.

Further, an interlayer insulating layer 130 and the touch signal transfer wiring 175 are disposed on the insulating substrate 100, the touch wiring 330 is disposed under the encapsulation substrate 200, and the touch pad part TP is disposed between the touch signal transfer wiring 175 and the touch wiring 330.

The touch pad part TP may include an insulating layer 180 including a protrusion 180a and an opening 180b and a connection conductor 195a formed on the insulating layer 180 to conduct the touch wiring 330 with the touch signal transfer wiring 175.

The protrusion 180a is formed to protrude upward toward the encapsulation substrate and cover the touch signal transfer wiring 175. The opening 180b is formed to expose a portion of the touch signal transfer wiring 175. The connection conductor 195a is connected to the touch wiring 330, formed on the protrusion 180a, and connected to the touch signal transfer wiring 175 through the opening 180b.

In more detail, the protrusion 180a encloses a circumference of the opening 180b, and the connection conductor 195a covers the protrusion 180a and the opening 180b.

That is, the touch pad part TP includes a single opening 180b and a single protrusion 180a, and a center thereof is provided with the opening 180b through which a portion of the touch signal transfer wiring 175 is exposed and is provided with the protrusion 180a enclosing the circumference of the opening 180b.

The protrusion 180a may be formed to protrude upward toward the touch wiring 330, and the connection conductor 195a disposed on the protrusion 180a may contact the touch wiring 330.

The opening 180b may be formed to expose a portion of the touch signal transfer wiring 175, and the connection conductor 195a positioned on the opening 180b may contact the touch signal transfer wiring 175.

That is, the connection conductor 195a may conduct the touch wiring 330 with the touch signal transfer wiring 175 and may be positioned on the opening 180b and the protrusion 180a.

Figure 4:
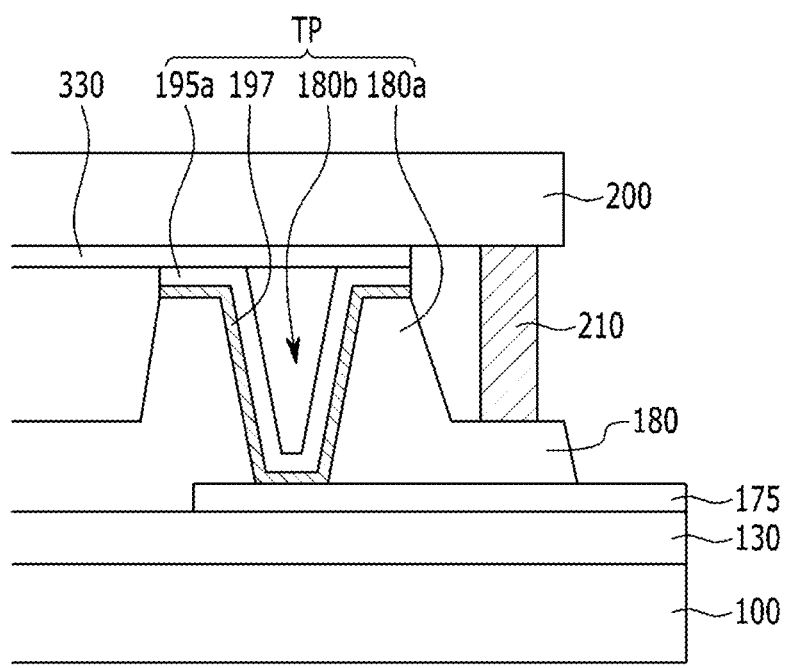
FIG. 4 is a cross-sectional view of the touch pad part according to an exemplary embodiment of the present disclosure.

According to another exemplary embodiment of the present disclosure, such as that shown in FIG. 4, the touch pad part TP of the organic light emitting diode display may further include a sub-connection conductor 197.

Referring to FIG. 4, the touch pad part TP may include the insulating layer 180 including the protrusion 180a and the opening 180b to conduct the touch wiring 330 with the touch signal transfer wiring 175 and the sub-connection conductor 197 in addition to the connection conductor 195a formed on the insulating layer 180.

The sub-connection conductor 197 may be formed between the insulating layer 180 and the connection conductor 195a to facilitate the transfer of the touch signal between the touch wiring 330 and the touch signal transfer wiring 175.

The sub-connection conductor 197 may be made of conductive metal materials such as Au or Ag.

Hereinafter, the touch pad part TP according to another exemplary embodiment of the present disclosure is described with reference to FIGS. 5 and 6.

Figure 5:
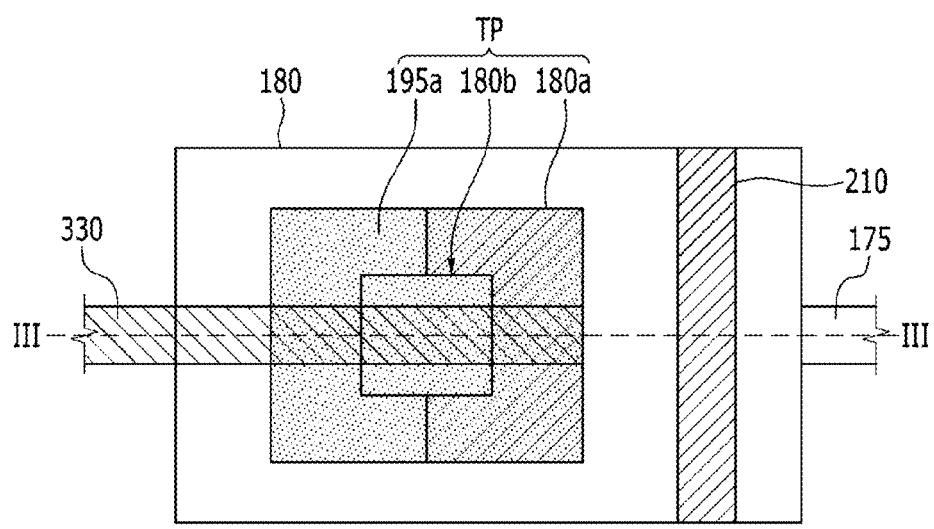
FIG. 5 is a plan view of a touch pad part according to another exemplary embodiment of the present disclosure.

FIG. 5 is a plan view of a touch pad part according to another exemplary embodiment of the present disclosure. FIG. 6 is a cross-sectional view of the touch pad part taken along the line VI-VI of FIG. 5 according to another exemplary embodiment of the present disclosure. The touch pad part of FIGS. 5 and 6 is the same as the touch pad part described above with reference to FIGS. 2 and 3 except that the structure of the protrusion 180a is changed. Therefore, the same components common to both embodiments are denoted by the same reference numerals, and the repeated description thereof is omitted.

Figure 6:
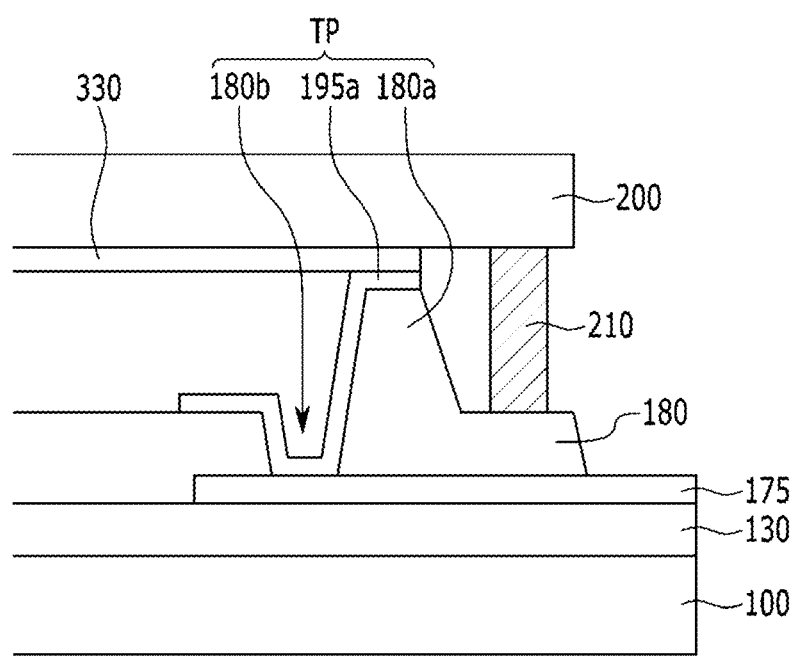
FIG. 6 is a cross-sectional view of the touch pad part according to another exemplary embodiment of the present disclosure.

Referring to FIGS. 5 and 6, the touch pad part TP may include an insulating layer 180 including a protrusion 180a and an opening 180b and a connection conductor 195a formed on the insulating layer 180 to conduct the touch wiring 330 with the touch signal transfer wiring 175.

The protrusion 180a is formed to protrude upward toward the encapsulation substrate 200 and covers the touch signal transfer wiring 175. The opening 180b is formed to expose a portion of the touch signal transfer wiring 175. The connection conductor 195a is connected to the touch wiring 330, formed on the protrusion 180a, and connected to the touch signal transfer wiring 175 through the opening 180b.

In this case, one end of the touch pad part TP is provided with the opening 180b, and the other end of the touch pad part TP is provided with the protrusion 180a. That is, the protrusion 180a may be formed at one side of the circumference of the opening 180b.

The connection conductor 195a positioned on the protrusion 180a is connected to the touch wiring 330, and the connection conductor 195a formed on the opening 180b contacts the touch signal transfer wiring 175.

That is, the connection conductor 195a may conduct the touch wiring 330 with the touch signal transfer wiring 175 and may be positioned on the protrusion 180a and the opening 180b.

FIGS. 4 and 5 illustrate that the protrusion 180a is formed between the sealing member 210 and the opening 180b, but the present disclosure is not limited thereto, and the opening 180b of the touch pad part TP according to an exemplary embodiment of the present disclosure may be formed between the sealing member 210 and the protrusion 180a.

Hereinafter, the touch pad part TP according to another exemplary embodiment of the present disclosure is described with reference to FIGS. 7 and 8.

Figure 7:
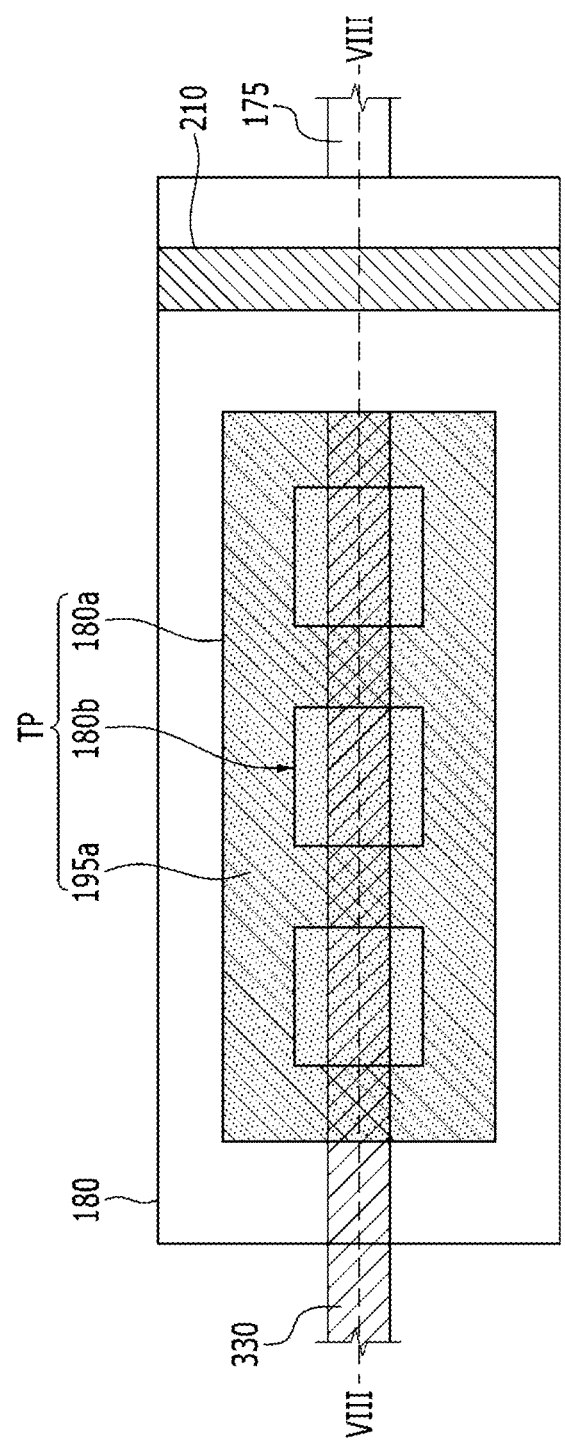
FIG. 7 is a plan view of a touch pad part according to another exemplary embodiment of the present disclosure.

FIG. 7 is a plan view of a touch pad part according to another exemplary embodiment of the present disclosure. FIG. 8 is a cross-sectional view of the touch pad part taken along the line VIII-VIII of FIG. 7 according to another exemplary embodiment of the present disclosure. The touch pad of FIGS. 7 and 8 is the same as that described above with reference to FIGS. 2 and 3 except that the structure of the touch pad part is changed. Therefore, the same components common to both embodiments are denoted by the same reference numerals, and the repeated description thereof is omitted.

Figure 8:
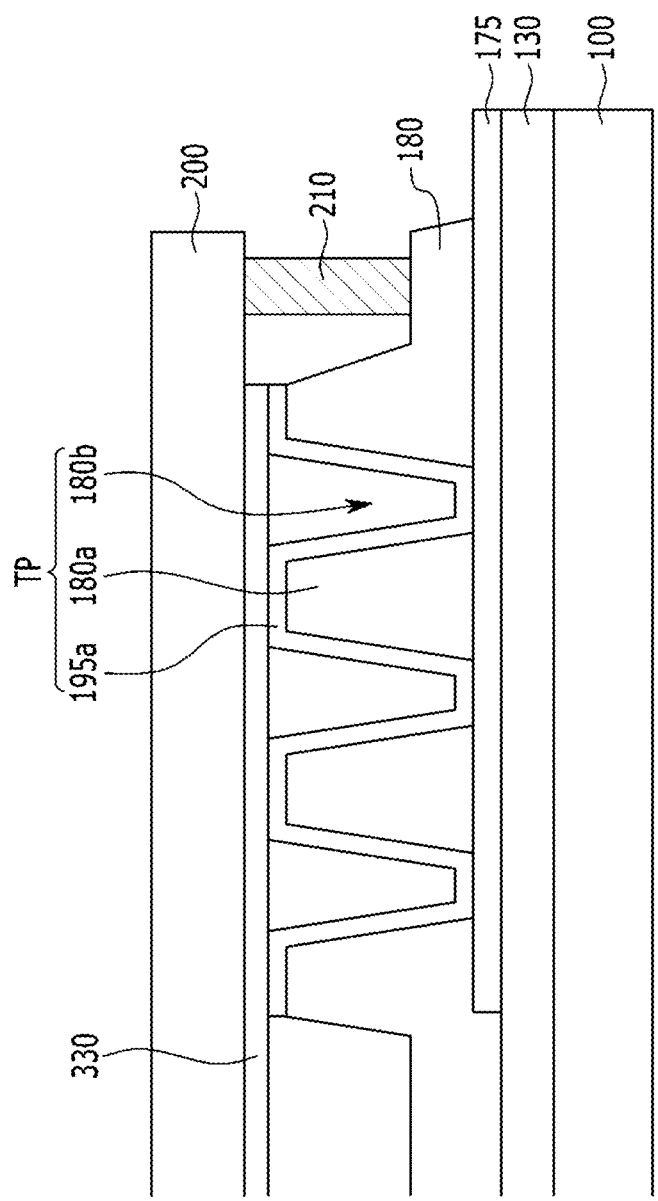
FIG. 8 is a cross-sectional view of the touch pad part according to another exemplary embodiment of the present disclosure.

Referring to FIGS. 7 and 8, the touch pad part TP may include an insulating layer 180 including a plurality of protrusions 180a and a plurality of openings 180b and a connection conductor 195a formed on the insulating layer 180 to conduct the touch wiring 330 with the touch signal transfer wiring 175.

The protrusions 180a are formed on the insulating substrate 100 and protrude toward the touch wiring 330. The openings 180b are formed to expose a portion of the touch signal transfer wiring 175. The connection conductor 195a may conduct the touch signal transfer wiring 175 with the touch wiring 330 and may be formed on the protrusions 180a and the openings 180b.

Compared to the touch pad part TP illustrated in FIGS. 2 and 3, the touch pad part TP of FIGS. 7 and 8 includes the plurality of openings 180b through which the touch signal transfer wiring 175 is partially exposed, and the plurality of protrusions 180a are formed between the openings 180b, thereby expanding the area in which the connection conductor 195a may contact the touch signal transfer wiring 175 and the touch wiring 330.

That is, the touch pad part TP of FIGS. 7 and 8 has an expanded contact area in which the connection conductor 195a contacts the touch signal transfer wiring 175 and the touch wiring 330, thereby more efficiently transferring a touch control signal passing through the touch signal transfer wiring 175 and the touch wiring 330.

Three openings 180b are illustrated in the drawing, but the touch pad part TP according to some exemplary embodiments of the present disclosure may include more openings 180b.

Hereinafter, an organic light emitting diode display according to an exemplary embodiment of the present disclosure is described with reference to FIG. 9.

Figure 9:
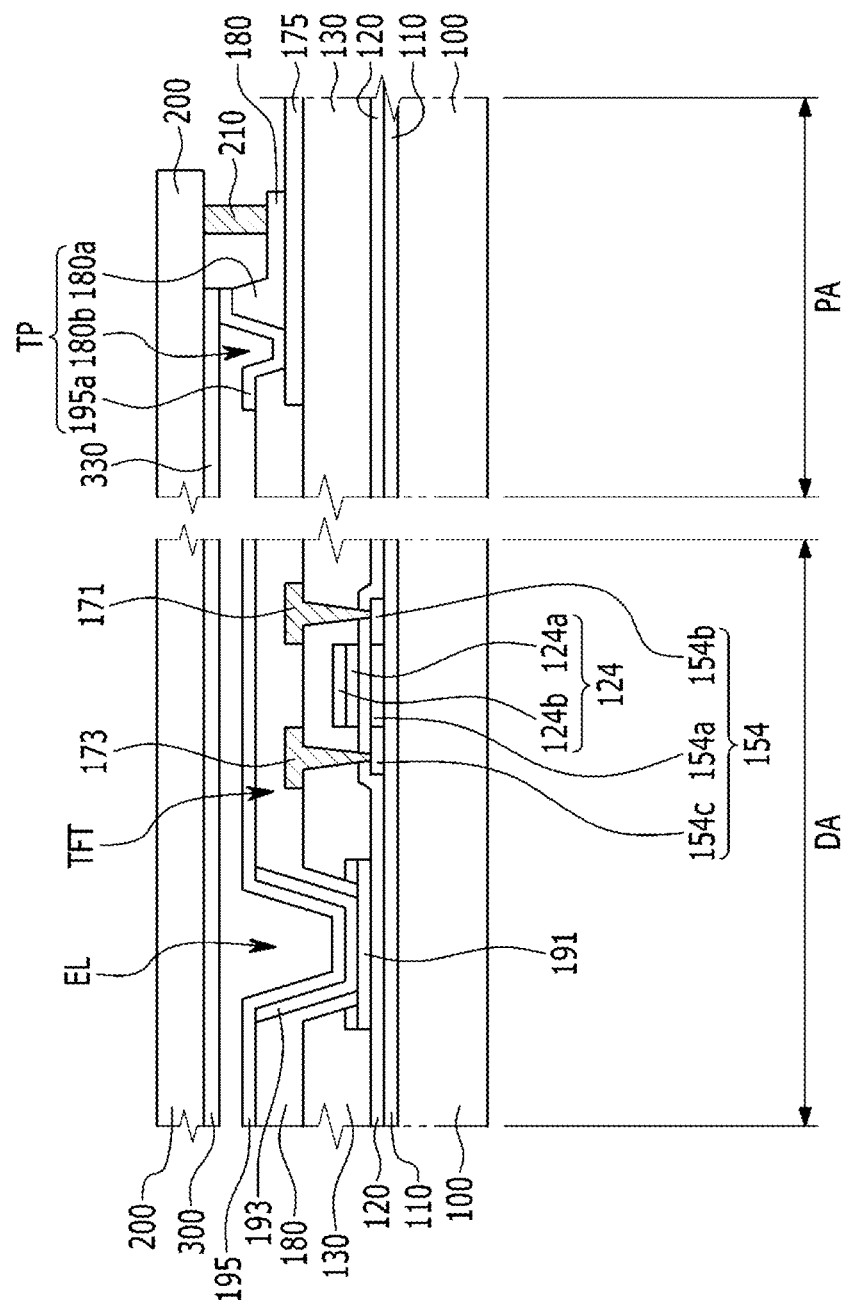
FIG. 9 is a cross-sectional view schematically illustrating a portion of an organic light emitting diode display according to an exemplary embodiment of the present disclosure.

FIG. 9 is a cross-sectional view schematically illustrating a portion of an organic light emitting diode display according to an exemplary embodiment of the present disclosure. Referring to FIG. 9, the organic light emitting diode display includes a thin film transistor (TFT) and an organic electroluminescent element EL disposed in the display area DA in which the plurality of pixels are formed and the touch pad part TP disposed in the peripheral area PA.

First, describing the structure of the display area DA, the thin film transistor (TFT) is configured to include a semiconductor layer 154, a gate electrode 124, source/drain electrodes 171 and 173, and the like.

The buffer layer 110 is disposed on the insulating substrate 100 and may be formed as a single layer made of silicon nitride (SiNx) or two layers in which silicon nitride (SiNx) and silicon oxide $SiO_2$ are stacked. The buffer layer 110 serves to provide a planar surface and prevent permeation of unnecessary components, such as impurities or moisture.

The semiconductor layer 154 is disposed on the buffer layer 110. The semiconductor layer 154 is made of polycrystalline silicone and includes a channel region 154a, a source region 154b, and a drain region 154c. The source region 154b and the drain region 154c are each disposed at opposite sides of the channel region 154a.

The channel region 154a is polysilicon that is not doped with an impurity, that is, intrinsic semiconductor, and the source region 154b and the drain region 154c are polysilicon that is doped with a conductive impurity, that is, impurity semiconductor.

The gate insulating layer 120 is disposed on the semiconductor layer 154. The gate insulating layer 120 may be a single layer or a plurality of layers and may include at least one of silicon nitride, silicon oxide, and the like.

The gate electrode 124 of the thin film transistor TFT is disposed on the gate insulating layer 120 and overlaps the channel region 154a of the semiconductor layer 154. The gate electrode 124 is configured of a gate lower electrode 124a and a gate upper electrode 124b, and the gate lower electrode 124a is made of a transparent conductive material.

The interlayer insulating layer 130 is disposed on the gate electrode 124 and the pixel electrode 191.

The interlayer insulating layer 130 is provided with contact holes through which the source region 154a and the drain region 154b of the semiconductor layer 154 are each exposed.

The source electrode 171 connected to the source region 154b of the semiconductor layer 154 and the drain electrode 173 connected to the drain region 154c of the semiconductor layer 154 are disposed on the interlayer insulating layer 130.

The organic electroluminescent element EL includes the pixel electrode 191 that is connected to one of the source/drain electrodes 171 and 173 of the thin film transistor TFT, a common electrode 195 serving as a cathode, and an organic emission layer 193 interposed between the pixel electrode 191 and the common electrode 195.

The pixel electrode 191 is disposed on the gate insulating layer 120 and is an anode of the organic electroluminescent element EL.

The pixel electrode 191 may be made of transparent conductive materials, such as indium tin oxide (ITO), indium zinc oxide (IZO), zinc oxide (ZnO) and indium oxide ($In_2O_3$), or reflective metals, such as lithium (Li), calcium (Ca), lithium fluoride/calcium (LiF/Ca), lithium fluoride/aluminum (LiF/Al), aluminum (Al), silver (Ag), magnesium (Mg), and gold (Au).

The insulating layer 180 is disposed at an edge of the pixel electrode 191 and on the passivation layer 130.

The insulating layer 180 is a pixel defined layer 180 that partitions the emission area of the organic electroluminescent element EL in the display area DA. The pixel defined layer 180 is formed to cover the display area DA as a whole, except for the emission area.

The pixel defined layer 180 has a pixel contact part through which the pixel electrode 191 is exposed. The pixel defined layer 180 may be made of resin such as polyacrylates or polyimides.

The organic emission layer 193 is disposed on the pixel electrode 191 exposed by the pixel contact part. The organic emission layer 193 is formed of a plurality of layers, which may include at least one of a light emitting layer, a hole-injection layer (HIL), a hole-transporting layer (HTL), an electron-transporting layer (ETL), and an electron-injection layer (EIL). When the organic emission layer 193 includes all of these layers, the hole-injection layer is disposed on the pixel electrode 191, which is the anode, and the hole-transporting layer, the light emitting layer, the electron-transporting layer, and the electron-injection layer may be sequentially stacked thereon.

The organic emission layer 193 may include one of a red organic emission layer that emits red light, a green organic emission layer that emits green light, and a blue organic emission layer that emits blue light. The red organic emission layer, the green organic emission layer, and the blue organic emission layer may be formed in a red pixel, a green pixel, and a blue pixel, respectively, to display a color image.

According to another exemplary embodiment, to display a color image, the organic emission layer 193 may include a stacked structure of the red organic emission layer, the green organic emission layer, and the blue organic emission layer in each of the red pixel, the green pixel, and the blue pixel, thereby forming a red color filter, a green color filter, and a blue color filter for each pixel. As another example, a white organic emission layer that emits white light in may be formed in each of the red pixel, the green pixel, and the blue pixel, and the red color filter, the green color filter, and the blue color filter may be formed for each pixel. At the time of forming the white organic emission layer and the color filters, there is no need to use a deposition mask for depositing the red organic emission layer, the green organic emission layer, and the blue organic emission layer on each pixel, that is, the red pixel, the green pixel, and the blue pixel.

The white organic emission layer may be formed of a single organic emission layer or may be configured to emit white light by stacking the plurality of organic emission layers. For example, the white organic emission layer may also include a configuration to emit white light by combining at least one yellow organic emission layer with at least one blue organic emission layer, a configuration to emit white light by combining at least one cyan organic emission layer with at least one red organic emission layer, and a configuration to emit white light by combining at least one magenta organic emission layer with at least one green organic emission layer, and the like.

The common electrode 195 is disposed on the pixel defined layer 180 and the organic emission layer 193. The common electrode 195 may be made of transparent conductive materials, such as ITO, IZO, ZnO, and $In_2O_3$, or reflective metals, such as lithium, calcium, lithium fluoride/calcium, lithium fluoride/aluminum, aluminum, silver, magnesium, and gold. The common electrode 195 is a cathode of the organic electroluminescent element EL.

The encapsulation substrate 200 is disposed to face the insulating substrate 100, and the touch electrode layer 300 is disposed under the encapsulation substrate 200 corresponding to the display area DA. The touch electrode layer 300 is described in detail below.

Next, the structure of the touch pad part TP of the peripheral area PA is described. The touch pad part TP is already described, and therefore the repeated description thereof is omitted. Further, FIG. 9 illustrates the touch pad part TP according to the exemplary embodiment of the present disclosure described with reference to FIG. 6, but the present disclosure is not limited thereto, and therefore, the foregoing various exemplary embodiments of the present disclosure may be included.

The touch pad part TP may include the insulating layer 180 and the connection conductor 195a formed on the insulating layer 180 that conducts the touch wiring 330 with the touch signal transfer wiring 175.

In this case, the insulating layer 180 includes the protrusion 180a and the opening 180b in the touch pad part TP of the peripheral area PA. The protrusion 180a of the insulating layer 180 may be made of the same material as the pixel defined layer 180 in the display area DA.

That is, the protrusion 180a of the insulating layer 180 may be made of resin such as polyacrylates or polyimides.

The connection conductor 195a may be connected to the touch wiring 330, formed on the protrusion 180a, and connected to the touch signal transfer wiring 175 through the opening 180b. In this case, the connection conductor 195a may be made of the same material as the common electrode 195 of the organic electroluminescent element EL.

That is, the connection conductor 195a may be made of transparent conductive materials, such as ITO, IZO, ZnO, and $In_2O_3$, or reflective metals, such as lithium, calcium, lithium fluoride/calcium, lithium fluoride/aluminum, aluminum, silver, magnesium, and gold.

The touch signal transfer wiring 175 may be made of the same material as a data line including the source/drain electrodes 171 and 173. Further, although not illustrated, the touch signal transfer wiring 175 may be made of the same material as a gate line including the gate electrode 124. In this case, when the touch signal transfer wiring 175 is made of the same material as the gate line, the touch signal transfer wiring 175 may be disposed on the gate insulating layer 120 and the interlayer insulating layer 130, and the pixel defined layer 180 may be provided with the opening 180b through which the touch signal transfer wiring 175 is exposed.

As described above, according to an exemplary embodiment of the present disclosure, the organic light emitting diode display includes the protrusion 180a and the connection conductor 195a that conducts the touch signal transfer wiring 175 positioned on the insulating substrate 100 with the touch wiring 330 positioned under the encapsulation substrate 200. The protrusion 180a is made of the same material as the pixel defined layer 180, which partitions the emission layer, and the connection conductor 195a is made of the same material as the common electrode 195 and conducts the touch signal transfer wiring 175 with the touch wiring 330. As a result, an additional process for forming the separate insertion may be omitted.

Figure 10:
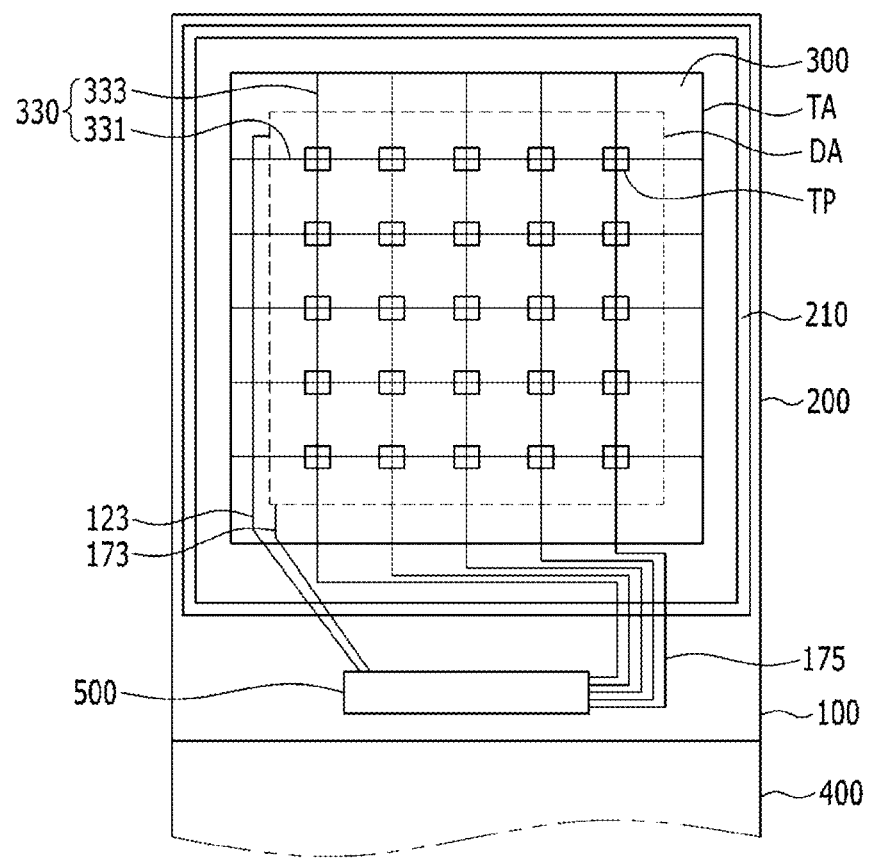
FIG. 10 is a plan view of the organic light emitting diode display according to an exemplary embodiment of the present disclosure.
Figure 11:
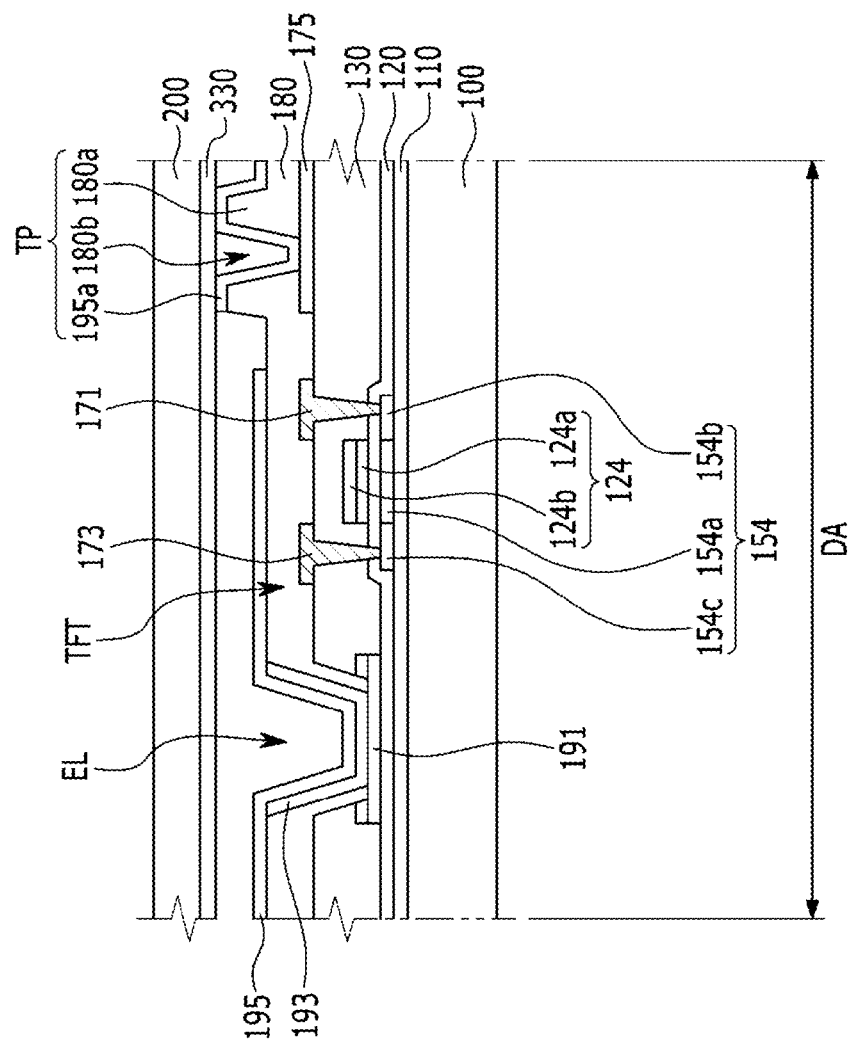
FIG. 11 is a cross-sectional view schematically illustrating a portion of the organic light emitting diode display according to an exemplary embodiment of the present disclosure.

Hereinafter, a display device according to an exemplary embodiment of the present disclosure is described with reference to FIGS. 10 and 11. FIG. 10 is a plan view of the organic light emitting diode display, and FIG. 11 is a cross-sectional view schematically illustrating a portion of the organic light emitting diode display. The display device of FIGS. 10 and 11 is the same as the organic light emitting diode display illustrated in FIGS. 1 and 9 and described above, except that the position of the touch pad part is changed. Therefore, the same components are denoted by the same reference numerals, and the repeated description thereof is omitted.

Referring to FIGS. 10 and 11, the display device according to an exemplary embodiment of the present disclosure includes the insulating substrate 100, which includes the display area DA displaying an image and the peripheral area PA disposed around the display area DA, the encapsulation substrate 200 including the touch area TA corresponding to the display area DA of the insulating substrate 100 and facing the insulating substrate 100, and the flexible printed circuit board 400 that is formed at an edge of one side of the insulating substrate 100 and attached to the insulating substrate 100.

The display area DA of the insulating substrate 100 may include the thin film transistor TFT, the organic electroluminescent element EL, and the touch pad part TP.

The touch pad part TP may include the insulating layer 180 including the protrusion 180a and the opening 180b and the connection conductor 195a formed on the insulating layer 180 that conducts the touch wiring 330 with the touch signal transfer wiring 175 in the display area DA of the insulating substrate 100.

That is, the touch pad part TP in the organic light emitting diode display illustrated in FIGS. 1 and 9 is disposed in the peripheral area PA of the insulating substrate 100, but the touch pad part TP in the organic light emitting diode display illustrated in FIGS. 10 and 11 is disposed in the display area DA of the insulating substrate 100.

In this case, the insulating layer 180 may include the pixel defined layer that partitions the emission area of the organic electroluminescent element EL and the protrusion 180a and the opening 180b of the touch pad part TP.

Further, the common electrode 195, which is the cathode, is disposed on the pixel defined layer 180 and the organic emission layer 193, and the connection conductor 195a is disposed on the insulating layer 180 of the touch pad part TP. The common electrode 195 and the connection conductor 195a may be made of the same material and are denoted by the same reference numeral.

Next, the touch electrode layer 300 according to an exemplary embodiment of the present disclosure is described in detail with reference to FIGS. 12 to 14.

Figure 12:
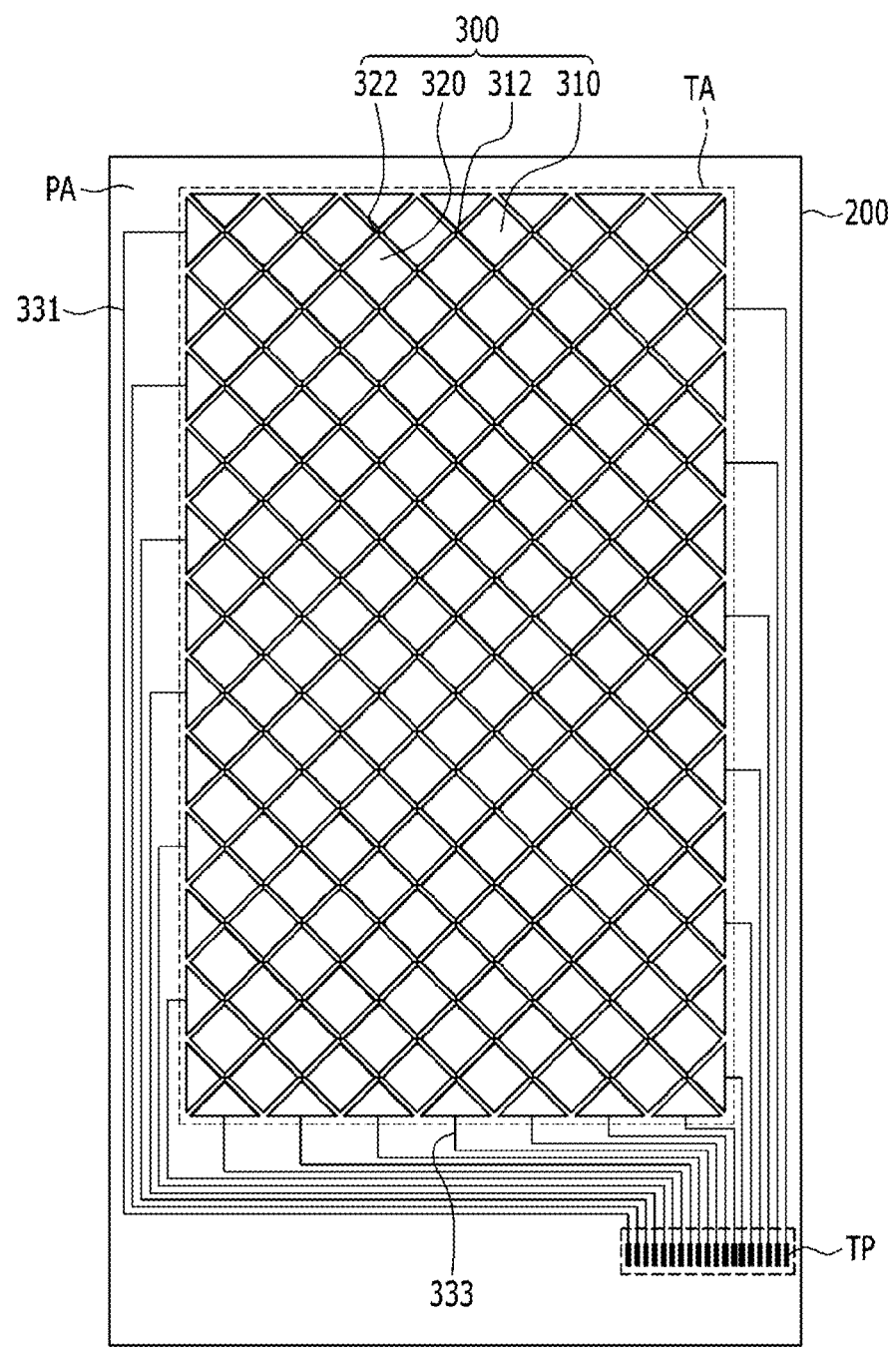
FIG. 12 is a plan view illustrating a touch electrode layer of the organic light emitting diode display illustrated in FIGS. 1 to 11.

FIG. 12 is a plan view illustrating a touch electrode layer of the organic light emitting diode display illustrated in FIGS. 1 to 11. FIG. 13 is an enlarged view of a portion of the touch electrode layer illustrated in FIG. 12. FIG. 14 is a cross-sectional view taken along the line XIV-XIV of FIG. 13.

Referring to FIG. 12, the touch electrode layer 300 is disposed under the encapsulation substrate 200. The touch electrode layer 300 is disposed in the touch area TA where a touch may be sensed. The touch area TA may include the entire display area DA of the insulating substrate 100 and a portion of the peripheral area PA of the insulating substrate 100. Further, the touch area TA may only overlap with the display area DA of the insulating substrate 100.

The touch electrode layer 300 may sense a contact using various methods. For example, the contact sensing may be classified into various types, such as a resistive type, a capacitive type, an electro-magnetic (EM) type, and an optical type.

According to an exemplary embodiment of the present disclosure, the capacitive type contact sensing is described by way of example.

The touch electrode layer 300 includes a plurality of touch electrodes. The plurality of touch electrodes may include a plurality of first touch electrodes 310 and a plurality of second touch electrodes 320. The first touch electrodes 310 and the second touch electrodes 320 are separated from each other.

The plurality of first touch electrodes 310 and the plurality of second touch electrodes 320 are alternately dispersed and disposed so as not to overlap each other in the touch area TA. The plurality of first touch electrodes 310 are disposed along a column direction and a row direction, and the plurality of second touch electrodes 320 are also disposed along a column direction and a row direction.

The first touch electrodes 310 and the second touch electrodes 320 may be disposed on the same layer or on different layers. Further, the first touch electrode 310 and the second touch electrode 320 may each be a quadrangular shape, but are not limited thereto, and may have various shapes having a protruding area, and the like, to improve the sensitivity of the touch electrode layer 300.

The plurality of first touch electrodes 310 arranged in the same row or column may be connected to or separated from each other inside or outside the touch area TA. Likewise, at least some of the plurality of second touch electrodes 320 arranged in the same row or column may also be connected to or separated from each other inside or outside the touch area TA. For example, as illustrated in FIG. 12, when the plurality of first touch electrodes 310 disposed in the same row are connected to each other in the touch area TA, the plurality of second touch electrodes 320 disposed in the same column may be connected to each other inside the touch area TA. In more detail, the plurality of first touch electrodes 310 disposed in each row are connected to each other through the first connection part 312, and the plurality of second touch electrodes 320 positioned in each column are connected to each other through the second connection part 322.

The first touch electrodes 310, which are connected to each other in each row, are connected to the connection conductor 195a through the first touch wiring 331, and the second touch electrodes 320, which are connected to each other in each column, are connected to the connection conductor 195a through the second touch wiring 333. As illustrated in FIG. 12, the first touch wiring 331 and the second touch wiring 333 may be positioned in the peripheral area PA but may be positioned in the touch area TA. Ends of the first touch wiring 331 and the second touch wiring 333 may be connected to the touch pad part TP in the peripheral area PA of the encapsulation substrate 200.

Figure 13:
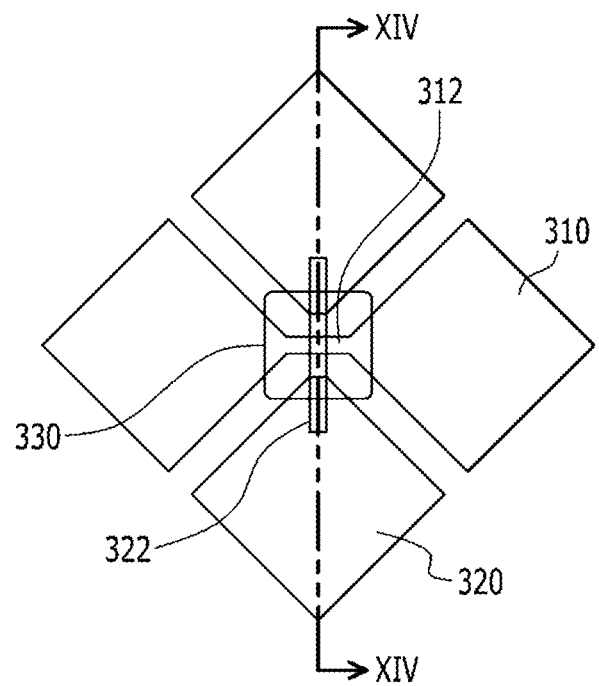
FIG. 13 is an enlarged view of a portion of the touch electrode layer illustrated in FIG. 12.
Figure 14:
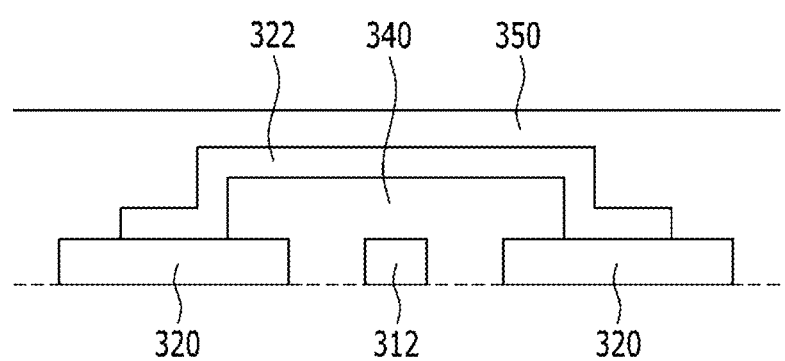
FIG. 14 is a cross-sectional view taken along the line XIV-XIV of FIG. 13.

Referring to FIGS. 13 and 14, the first connection part 312, which connects between the first touch electrodes 310 adjacent to each other, may be disposed on the same layer as the first touch electrode 310 and may be made of the same material as the first touch electrode 310. That is, the first touch electrode 310 and the first connection part 312 may be integrally formed with each other and may be simultaneously patterned.

The second connection part 322, which connects between the second touch electrodes 320 adjacent to each other, may be disposed on a different layer from that of the second touch electrode 320. That is, the second touch electrode 320 and the second connection part 322 may be separately formed and may be separately patterned. The second touch electrode 320 and the second connection part 322 may be connected to each other through a direct contact.

The first insulating layer 340 is positioned between the first connection part 312 and the second connection part 322 to isolate the first connection part 312 from the second connection part 322. The first insulating layer 340 may be a plurality of independent island type insulators that are disposed at each intersecting part between the first connection part 312 and the second connection part 322. The first insulating layer 340 may expose at least a portion of the second touch electrode 320 so that the second connection part 322 may be connected to the second touch electrode 320. The first insulating layer 340 may have an edge in a rounded shape and a polygon and may be made of SiOx, SiNx, or SiOxNy.

The second insulating layer 350 is positioned on the first touch electrode 310, the second touch electrode 320, and the second connection part 322. The second insulating layer 350 is disposed over the whole of the touch region TA and may be made of SiOx, SiNx, or SiOxNy.

According to another exemplary embodiment, the second connection part 322, which connects between the second touch electrodes 320 adjacent to each other, may be positioned on the same layer as the first touch electrode 310 and integrally formed with the second touch electrode 320, and the first connection part 312, which connects between the first touch electrodes 310 adjacent to each other, may be positioned on a different layer from the first touch electrode 310.

The first touch electrode 310 and the second touch electrode 320 may have a predetermined transmittance or more such that light from the organic emission layer 193 may be transmitted therethrough. For example, the first touch electrode 310 and the second touch electrode 320 may be made of a thin metal layer of indium tin oxide (ITO), indium zinc oxide (IZO), silver nano wire (AgNw), and the like or may be made of a transparent conductive material of metal mesh, carbon nanotube (CNT), and the like, but are not limited thereto. A material of the first connection part 312 and the second connection part 322 is as previously stated.

The first touch wiring 311 and the second touch wiring 321 may include the transparent conductive material included in the first touch electrode 310 and the second touch electrode 320 or low resistance materials such as molybdenum (Mo), silver (Ag), titanium (Ti), copper (Cu), aluminum (Al), and molybdenum/aluminum/molybdenum (Mo/Al/Mo).

The first and second touch electrodes 310 and 320 that are adjacent to each other form a mutual sensing capacitor and serve as a contact sensing sensor. The mutual sensing capacitor may receive a sensing input signal through one of the first and second touch electrodes 310 and 320 and output a change in a quantity of electrical charge due to a contact of an external object as a sensing output signal through the other touch electrodes.

According to another exemplary embodiment of the present disclosure, the plurality of first touch electrodes 310 and the plurality of second touch electrodes 320 may be separated from each other and thus may each be connected to the touch sensor controller through the touch wiring (not illustrated). In this case, the respective touch electrodes may form self-sensing capacitors as the contact sensing sensors. The self-sensing capacitor may receive the sensing input signal to be charged with a predetermined quantity of electrical charge, and generate a change in the quantity of charged electrical charge when the contact of the external objects, such as a finger, is present, thereby outputting the sensing output signal different from the received sensing input signal.

Hereinafter, a method of manufacturing an organic light emitting diode display according to an exemplary embodiment of the present disclosure is described with reference to the accompanying drawings.

FIGS. 15 to 21 are cross-sectional views sequentially illustrating a process of manufacturing an organic light emitting diode display according to an exemplary embodiment of the present disclosure.

Figure 15:
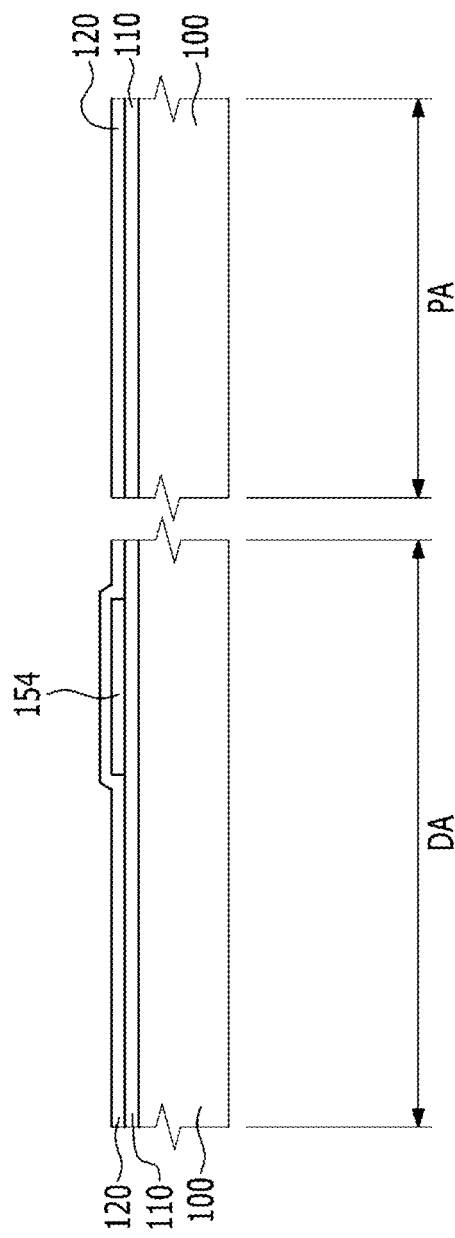
FIGS. 15, 16, 17, 18, 19, 20 and 21 are cross-sectional views sequentially illustrating a process of manufacturing an organic light emitting diode display according to an exemplary embodiment of the present disclosure.

First, referring to FIG. 15, the buffer layer 110, which planarizes the surface and prevents unnecessary components, such as impurity or moisture, from penetrating into the insulating substrate 100, is formed on the insulating substrate 100. The insulating substrate 100 includes the display area DA in which the plurality of pixels are first formed and the peripheral area PA positioned around the display area DA.

The insulating substrate 100 may be made of a glass material, such as a transparent material using $SiO_2$, as a main component. The substrate 100, however, is not limited thereto and may be made of various materials such as a transparent plastic material or a metal material.

Further, the semiconductor layer 154 of the thin film transistor TFT is formed on the buffer layer 110. The semiconductor layer 154 may be made of polycrystalline silicone and is formed by patterning in a first mask process using a first mask (not illustrated).

Next, the gate insulating layer 120 is formed on the semiconductor layer 154. The gate insulating layer 120 may be deposited with an inorganic insulating layer of SiNx, SiOx, or the like by methods such as a PECVD method, an APCVD method, an LPCVD method.

The gate insulating layer 120 may be a single layer or a plurality of layers including at least one of silicon nitride, silicon oxide, and the like.

Figure 16:
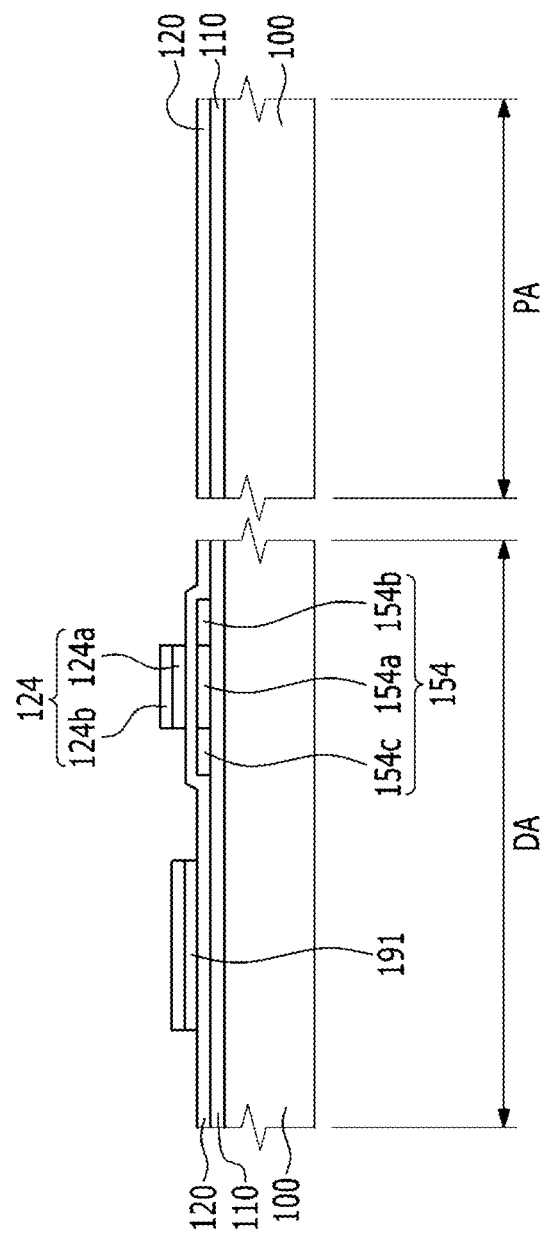

Next, as illustrated in FIG. 16, after the first conductive layer 124a and the second conductive layer 124b are sequentially deposited on the gate insulating layer 120, the pixel electrode 191 of the organic electroluminescent element EL and the gate electrode 124 of the thin film transistor TFT are formed by patterning in a second mask process using a second mask (not illustrated).

Here, the first conductive layer 124a may include at least one material selected from the transparent materials such as ITO, IZO, ZnO, or $In_2O_3$, and the second conductive layer 124b may include at least one material selected from a group consisting of Ag, Mg, Al, Pt, Pd, Au, Ni, Nd, Ir, Cr, Li, Ca, Mo, Ti, W, MoW, and Al/Cu.

The gate electrode 124 corresponds to a center of the semiconductor layer 154. When the semiconductor layer 154 is doped with an n type or p type impurity using the gate electrode 124 as the mask in this state, the channel region 154a is formed in the semiconductor layer 154 area covered with the gate electrode 124, and the source region 154b and the drain region 154c are each formed at an edge that is not covered.

The channel region 154a is polysilicon that is not doped with an impurity, that is, intrinsic semiconductor, and the source region 154b and the drain region 154c are polysilicon that is doped with a conductive impurity, that is, impurity semiconductor.

Figure 17:
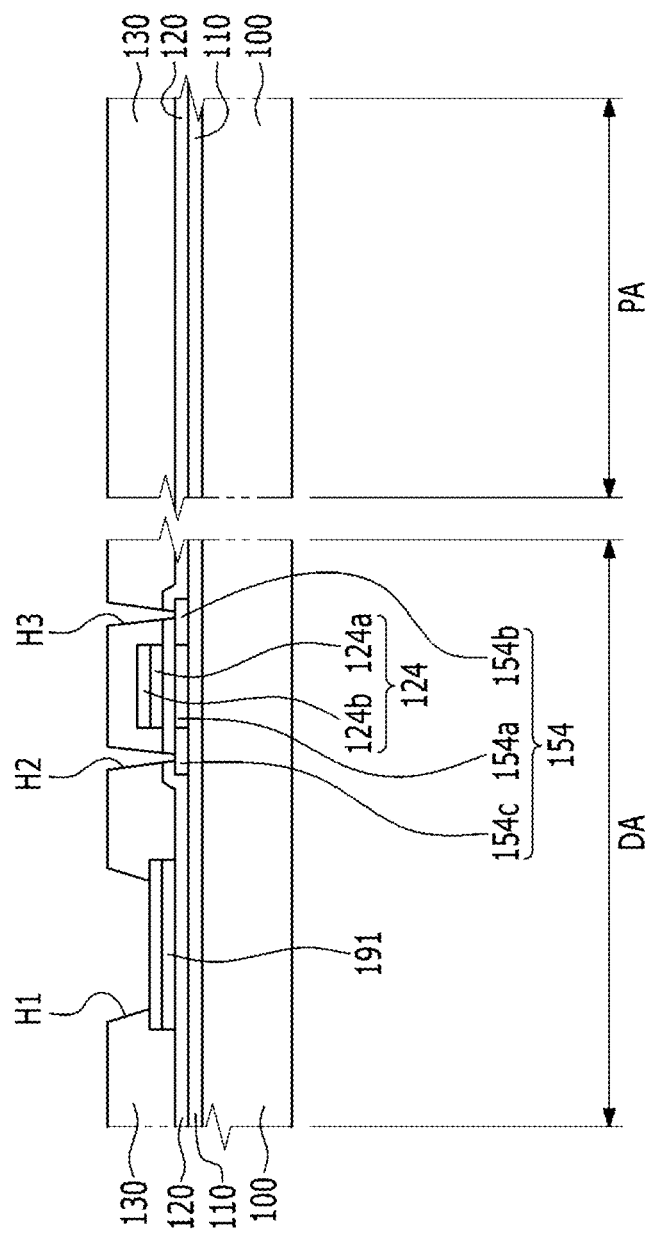

Next, referring to FIG. 17, the interlayer insulating layer 130 is deposited on the whole surface of the insulating substrate 100 on which the gate insulating layer 120 is formed, and contact holes H1, H2, and H3 are formed in a third mask process using a third mask (not illustrated).

The interlayer insulating layer 130 may be formed by performing spin coating on at least one organic insulating material selected from a group consisting of polyimide, polyamide, acrylic resin, benzocyclobutene, and phenol resin and is formed to be thicker than the foregoing gate insulating layer 120 to insulate between the gate electrode 124 and the source/drain electrodes 171 and 173 of the thin film transistor. The interlayer insulating layer 130 may be made of an organic insulating material and an inorganic insulating material and may be formed by alternately forming the organic insulating material and the inorganic insulating material.

Figure 18:
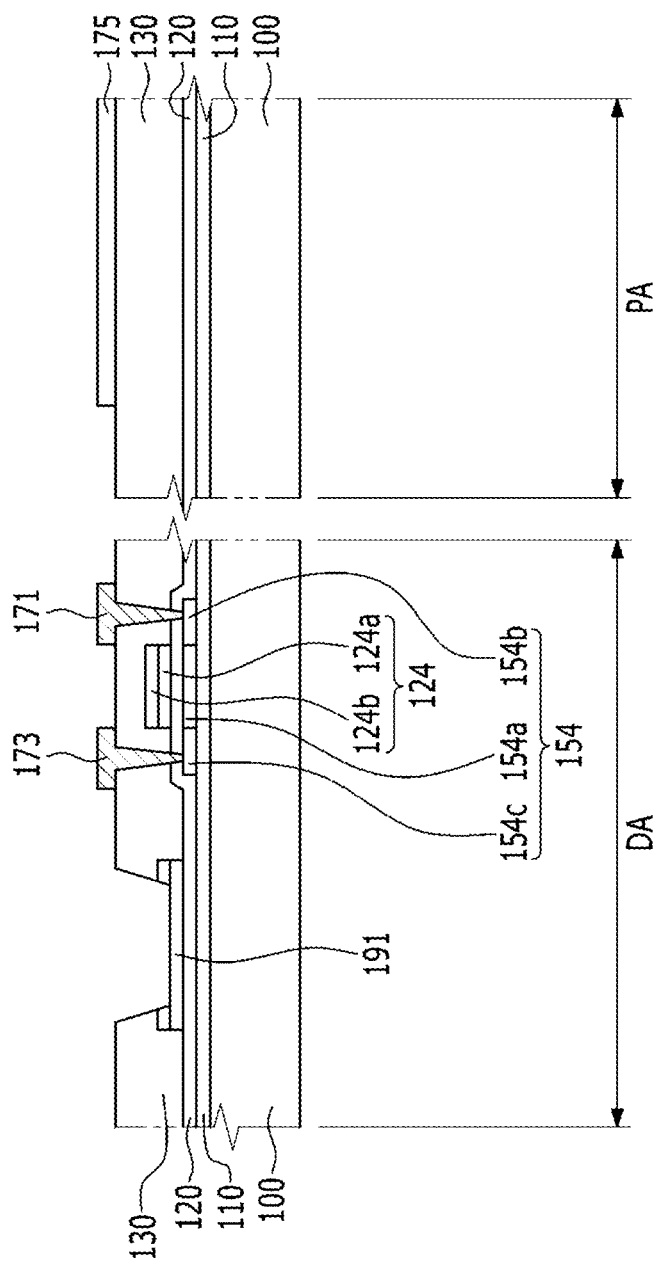

Next, referring to FIG. 18, a third conductive layer is deposited on the whole surface of the insulating substrate 100 on the interlayer insulating layer 130 and is patterned in a fourth mask process to form the source/drain electrodes 171 and 173 and the touch signal transfer wiring 175.

The source/drain electrodes 171 and 173 are formed in the display area DA of the insulating substrate 100, and the touch signal transfer wiring 175 is formed in the peripheral area PA of the insulating substrate 100.

The third conductive layer may be selected from the same conductive materials as the foregoing first or second conductive layer 124a or 124b and may also be made of a Mo/Al/Mo material.

In this case, the pixel electrode 191 is etched to expose the first conductive layer 124a. Meanwhile, although not illustrated in the present cross-sectional view, the drain electrode 173 is connected to the pixel electrode 191.

Figure 19:
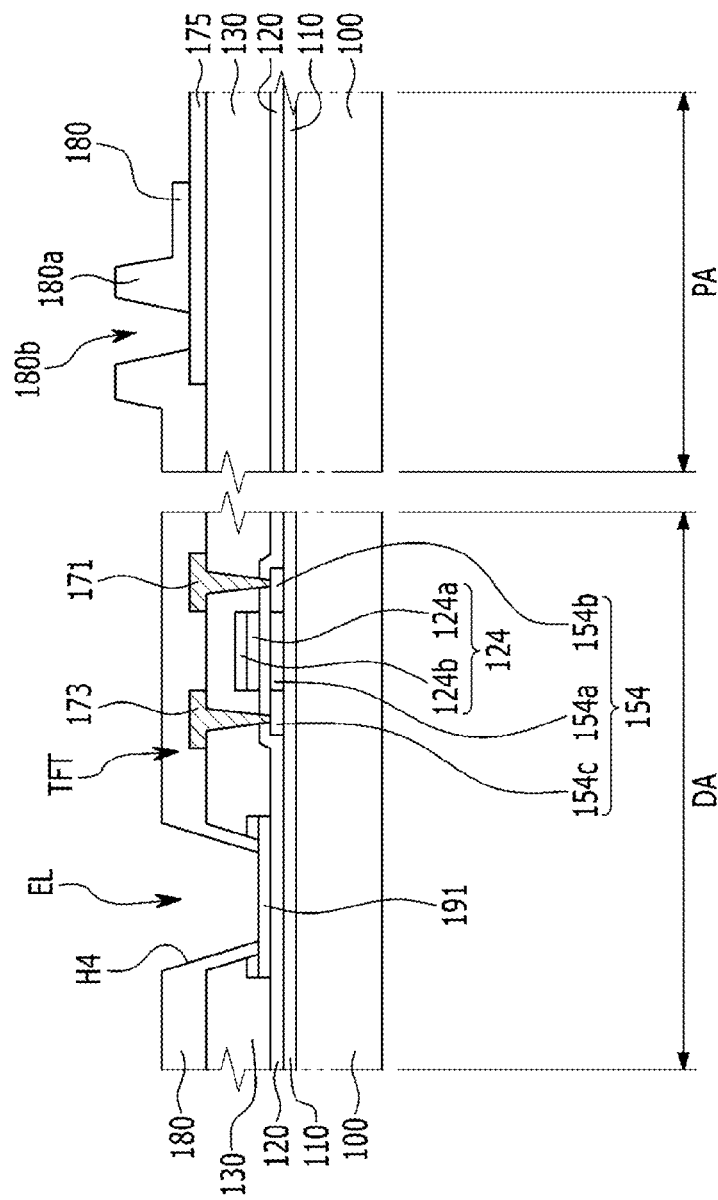

Next, referring to FIG. 19, the insulating layer 180 is formed on the insulating substrate 100. The insulating layer 180 may be formed by a method of performing spin coating, and the like, on at least one organic insulating material selected from a group consisting of polyimide, polyamide, acrylic resin, benzocyclobutene, and phenol resin.

The protrusion 180a and the opening 180b are formed in the peripheral area PA of the pixel defined layer 180 including the contact hole H4 in the display area DA by patterning the insulating layer 180 using a fifth mask process. In this case, a half tone mask may be used as a fifth mask. The connection hole H4 may expose the central portion of the pixel electrode 191, that is, the emission area.

The insulating layer 180 may include the protrusion 180a that protrudes upward and covers the touch signal transfer wiring 175 in the peripheral area PA and the opening 180b through which a portion of the touch signal transfer wiring 175 is exposed. In this case, the pixel defined layer 180 and the protrusion 180a may be formed by the same process using the same material.

Figure 20:
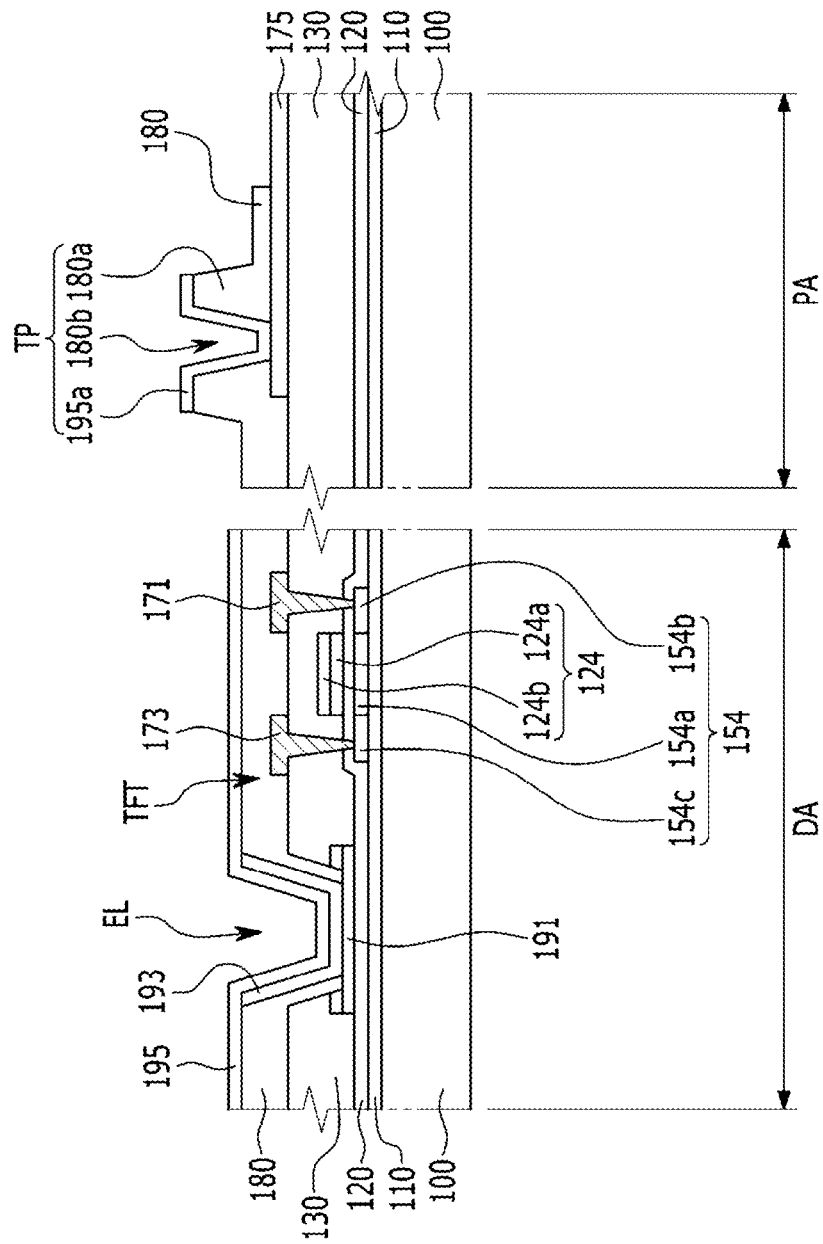

Next, referring to FIG. 20, the organic emission layer 193 is formed in the emission region on the pixel electrode 191, and then the common electrode 195 and the connection conductor 195a are formed.

The organic emission layer 193 is formed of a plurality of layers that include at least one of a light emitting layer, a hole-injection layer (HIL), a hole-transporting layer (HTL), an electron-transporting layer (ETL), and an electron-injection layer (EIL).

The common electrode 195 is formed in the display area DA of the insulating substrate 100, and the connection conductor 195a is formed in the peripheral area PA of the insulating substrate 100.

In this case, the common electrode 195 and the connection conductor 195a may be made of the same material.

The connection conductor 195a is connected to the touch signal transfer wiring 175 through the opening 180b.

Figure 21:
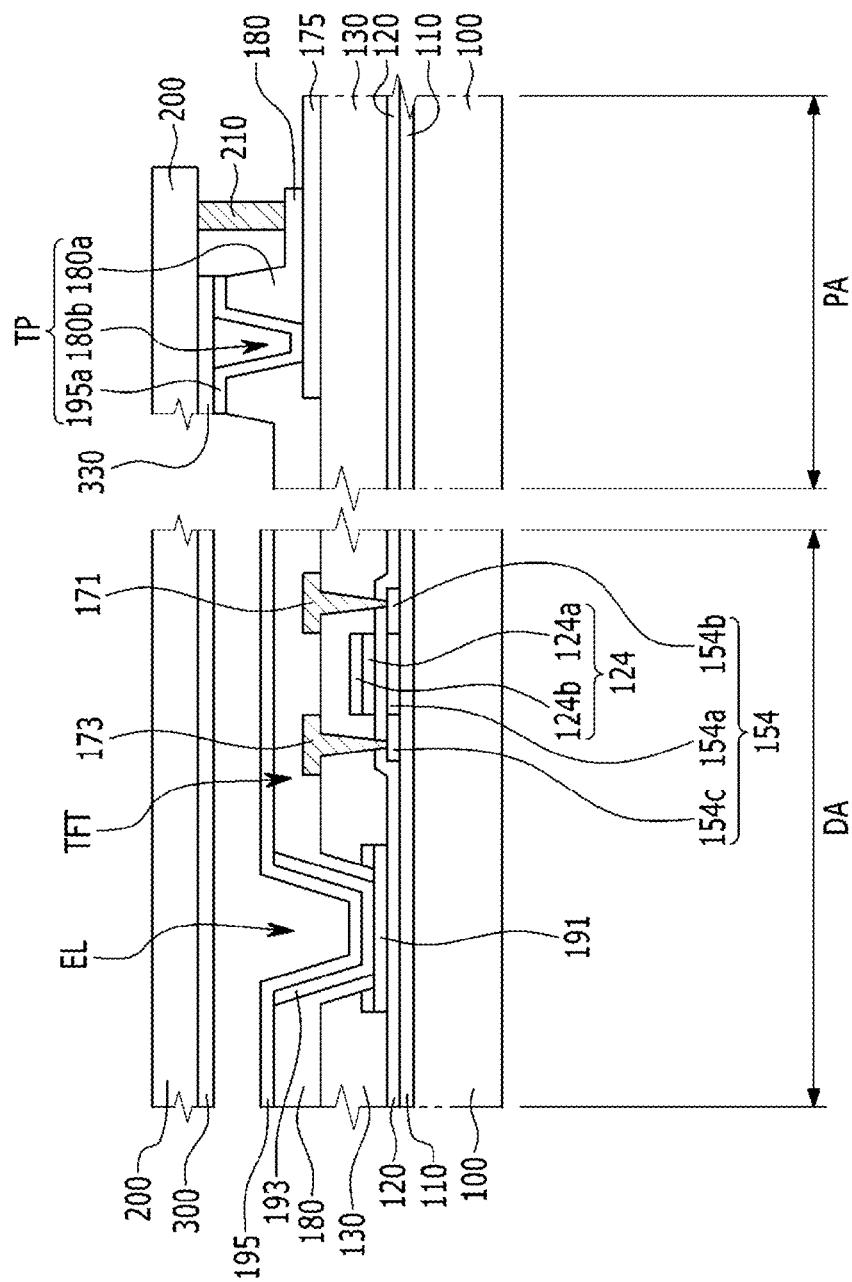

Next, referring to FIG. 21, the touch electrode layer 300 and the touch wiring 330 are formed under the encapsulation substrate 200, which includes the touch area TA corresponding to the display area DA of the insulating substrate 100 and the peripheral area PA positioned around the touch area TA and faces the insulating substrate 100. Thereafter, the sealing member 210 is applied, and then the encapsulation substrate 200 is sealed by being bonded on the insulating substrate 100.

The touch wiring 330 is connected to the touch electrode layer 300 and may be made of the same material by the same process as the touch electrode layer 300 or may be formed by a separate process.

In bonding and sealing the encapsulation substrate 200 on the insulating substrate 100, the touch signal transfer wiring 175 and the touch wiring 330 are pressed to adhere to each other through the connection conductor 195a.

In this case, in an organic light emitting diode display according to an exemplary embodiment of the present disclosure, the protrusion 180a and the connection conductor 195a are formed inside the sealing member so that the insulating substrate 100 adhere to the encapsulation substrate 200 to prevent internal penetration of out gassing that occurs at the time of forming the sealing member 210, thereby improving the lifespan of the organic emission element.

While the present system and method have been described in connection with exemplary embodiments, it is to be understood that the present system and method are not limited to the disclosed embodiments. On the contrary, the present system and method cover various modifications and equivalent arrangements included within the spirit and scope of the appended claims.

<Description of symbols>

100: Insulating substrate
175: Touch signal transfer wiring
180a: Protrusion
195a: Connection conductor
200: Encapsulation substrate
300: Touch electrode layer
400: Flexible printed circuit board (PCB)
DA: Display area
PA: Peripheral area
130: Passivation layer
180: insulating layer
180b: opening
197: Sub-connection conductor
210: Sealing member
330: Touch wiring
500: Driving driver
TA: Touch area

What is claimed is:

1. An organic light emitting diode display, comprising:
a substrate including a display area in which a plurality of pixels are disposed and a peripheral area positioned around the display area;
a thin film transistor comprising a gate electrode, a source electrode and a drain electrode;
a pixel electrode connected to the thin film transistor;
a common electrode overlapping the pixel electrode;
a touch signal transfer wiring disposed in the peripheral area on the substrate;
an insulating layer disposed on the substrate, the insulating layer covering at least a portion of the touch signal transfer wiring and including a protrusion and an opening partially overlapping the touch signal transfer wiring;
a connection conductor connected to the touch signal transfer wiring through the opening and disposed on the insulating layer;
an encapsulation substrate facing the substrate and including a touch area corresponding to the display area and a peripheral area disposed around the touch area;
a touch electrode layer disposed under the touch area of the encapsulation substrate; and
a touch wiring connected to the touch electrode layer and disposed under the peripheral area of the encapsulation substrate,
wherein the connection conductor is formed of a same material as the common electrode and is directly connected to the touch wiring and the touch signal transfer wiring which is formed of a same material as the source electrode,
wherein the connection conductor comprises a first portion, a second portion and a third portion, and
wherein the third portion is located between the first portion and the second portion, and the first portion and the second portion directly contact the touch wiring.

2. The organic light emitting diode display of claim 1, wherein:
the connection conductor is disposed in the peripheral area of the substrate.

3. The organic light emitting diode display of claim 2, further comprising:
a sealing member disposed at an outer region of the peripheral area of the substrate,
wherein the connection conductor is disposed inside the sealing member.

4. The organic light emitting diode display of claim 1, wherein:
the protrusion completely encloses a circumference of the opening.

5. The organic light emitting diode display of claim 1, wherein:
the protrusion is disposed at one side of a circumference of the opening.

6. The organic light emitting diode display of claim 1, wherein:
the insulating layer includes a plurality of openings and the protrusion encloses the plurality of openings.

7. The organic light emitting diode display of claim 1, wherein:
the insulating layer and the connection conductor are disposed in the display area.

8. The organic light emitting diode display of claim 1, further comprising:
an organic emission layer, and a pixel defined layer partitioning the organic emission layer that are disposed in the display area.

9. The organic light emitting diode display of claim 8, wherein:
the protrusion comprises the same material as the pixel defined layer.

10. A method of manufacturing an organic light emitting diode display, comprising:
providing a substrate including a display area in which a plurality of pixels are disposed and a peripheral area disposed around the display area;
forming a touch signal transfer wiring in the peripheral area on the substrate;
forming an insulating layer on the substrate, the insulating layer covering the touch signal transfer wiring on the substrate and including a protrusion formed to protrude upward and an opening partially overlapping the touch signal transfer wiring;
forming a connection conductor connected to the touch signal transfer wiring through the opening on the insulating layer;
providing an encapsulation substrate including a touch area corresponding to the display area and a peripheral area disposed around the touch area and facing the substrate;
forming a touch electrode layer under the touch area of the encapsulation substrate;
forming a touch wiring under the peripheral area of the encapsulation substrate, the touch wiring connected to the touch electrode layer; and
adhering the touch signal transfer wiring and the touch wiring to each other through the connection conductor by pressing the touch signal transfer wiring and the touch wiring toward each other,
wherein the insulation layer and the protrusion are formed of a same material and formed in one piece, and a maximum thickness of the insulating layer disposed in the peripheral area is greater than that disposed in the display area,
wherein the connection conductor directly connects the touch signal transfer wiring and the touch wiring,
wherein the connection conductor comprises a first portion, a second portion and a third portion, and
wherein the third portion is located between the first portion and the second portion, and the first portion and the second portion directly contact the touch wiring.

11. The method of claim 10, wherein:
the connection conductor is disposed in the peripheral area of the substrate.

12. The method of claim 11, further comprising:
positioning a sealing member at an outer region of the peripheral area of the substrate,
wherein the connection conductor is disposed inside the sealing member.

13. The method of claim 10, further comprising:
forming a pixel electrode, an organic emission layer, a common electrode, and a pixel defined layer partitioning the organic emission layer in the display area.

14. The method of claim 13, wherein:
the protrusion comprises a same material as the pixel defined layer.

15. The method of claim 13, wherein:
the connection conductor comprises a same material as the common electrode.

* * * * *